United States Patent
Kwon et al.

(10) Patent No.: US 10,494,547 B2
(45) Date of Patent: Dec. 3, 2019

(54) ADDITIVE COMPOSITION AND POSITIVE POLISHING SLURRY COMPOSITION INCLUDING THE SAME

(71) Applicant: KCTECH CO., LTD., Anseong-si (KR)

(72) Inventors: Jang Kuk Kwon, Anseong-si (KR); Sung Pyo Lee, Anseong-si (KR); Chang Gil Kwon, Namyangju-si (KR); Jun Ha Hwang, Pyeongtaek-si (KR)

(73) Assignee: KCTECH CO., LTD., Anseong-si (KR)

( * ) Notice: Subject to any disclaimer, the term of this patent is extended or adjusted under 35 U.S.C. 154(b) by 0 days.

(21) Appl. No.: 15/379,861

(22) Filed: Dec. 15, 2016

(65) Prior Publication Data

US 2017/0183538 A1    Jun. 29, 2017

(30) Foreign Application Priority Data

Dec. 24, 2015    (KR) .......................... 10-2015-0185769

(51) Int. Cl.
*C09G 1/02*     (2006.01)
*H01L 21/304*   (2006.01)
*H01L 21/3105*  (2006.01)

(52) U.S. Cl.
CPC .......... *C09G 1/02* (2013.01); *H01L 21/31053* (2013.01)

(58) Field of Classification Search
None
See application file for complete search history.

(56) References Cited

U.S. PATENT DOCUMENTS

| | | | | |
|---|---|---|---|---|
| 9,062,230 B2* | 6/2015 | Shi | ........................ | C09K 3/1409 |
| 2005/0233578 A1* | 10/2005 | Jia | ........................ | B23H 5/08 |
| | | | | 438/633 |
| 2006/0175298 A1* | 8/2006 | Zhao | ........................ | B24B 37/044 |
| | | | | 216/88 |
| 2008/0200098 A1* | 8/2008 | Moeggenborg | ........ | B24B 13/015 |
| | | | | 451/37 |
| 2009/0107851 A1* | 4/2009 | Kodera | ........................ | B23H 5/08 |
| | | | | 205/656 |
| 2009/0203215 A1* | 8/2009 | Yoshikawa | ............... | C09G 1/02 |
| | | | | 438/693 |
| 2010/0072418 A1* | 3/2010 | Mizutani | ................... | C09G 1/02 |
| | | | | 252/79.1 |
| 2012/0094490 A1* | 4/2012 | Choi | ........................ | C09G 1/02 |
| | | | | 438/693 |
| 2012/0100718 A1* | 4/2012 | Minami | .................... | C09G 1/02 |
| | | | | 438/693 |
| 2013/0313225 A1* | 11/2013 | Jin | ..................... | H01L 21/32125 |
| | | | | 216/53 |
| 2015/0104941 A1* | 4/2015 | Graham | ................... | C09G 1/02 |
| | | | | 438/693 |
| 2015/0166942 A1* | 6/2015 | Kang | ..................... | B08B 1/002 |
| | | | | 438/479 |

FOREIGN PATENT DOCUMENTS

| | | |
|---|---|---|
| CN | 1737885 A | 2/2006 |
| CN | 101679810 A | 3/2010 |
| CN | 102414293 A | 4/2012 |
| KR | 10-1470979 | 12/2014 |
| KR | 10-1524625 | 6/2015 |
| TW | 201235455 A | 9/2012 |

OTHER PUBLICATIONS

Office action issued in Korean Patent Application No. 10-2015-0185769.

* cited by examiner

*Primary Examiner* — Shamim Ahmed
(74) *Attorney, Agent, or Firm* — Oblon, McClelland, Maier & Neustadt, L.L.P.

(57) ABSTRACT

An additive composition and a positive polishing slurry composition including the additive composition are provided. The additive composition includes a cationic compound, an organic acid, a nonionic compound, and a pH adjuster.

9 Claims, 1 Drawing Sheet

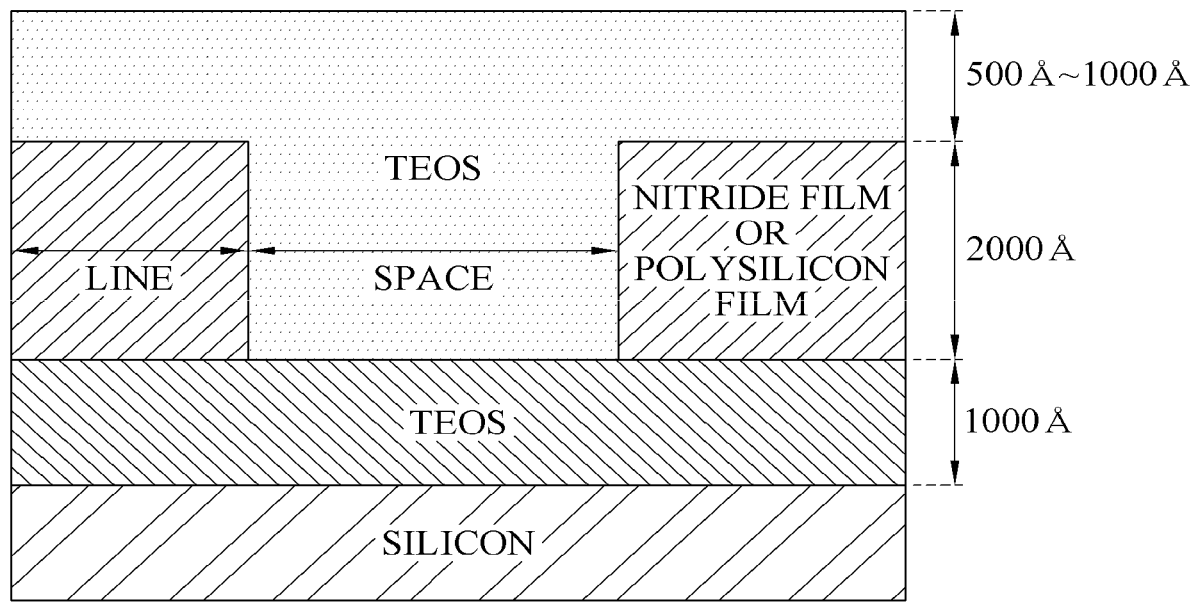

ADDITIVE COMPOSITION AND POSITIVE POLISHING SLURRY COMPOSITION INCLUDING THE SAME

CROSS-REFERENCE TO RELATED APPLICATIONS

This application claims the benefit of Korean Patent Application No. 10-2015-0185769 filed on Dec. 24, 2015, in the Korean Intellectual Property Office, the disclosure of which is incorporated herein by reference.

BACKGROUND

1. Field of the Invention

Embodiments relate to an additive composition and a positive polishing slurry composition including the additive composition.

2. Description of the Related Art

Chemical mechanical polishing (CMP) is one of semiconductor processing technologies of performing mechanical processing by an abrasive between a pressurized wafer and a polishing pad while performing chemical etching by chemical components of a slurry, and is used as an essential process of a widespread planarization technology in manufacturing of a semiconductor chip of a submicron scale. A slurry composition for oxides among slurry compositions may be used to polish an interlayer dielectric and a silicon oxide layer used for a shallow trench isolation (STI) process. A ceria slurry composition including ceria as abrasive particles is widely used to polish a silicon oxide layer in the STI process, and a silicon nitride layer is mainly used as a polishing stop layer. Generally, to increase a polishing selectivity of an oxide layer to a nitride layer, a predetermined chemical additive composition may be added to the ceria slurry composition. An additive composition may have a selectivity and a planarization degree based on a carboxylic group-containing polymer, and may be optimized for a negative slurry composition having negative charges. When the additive composition is used in a positive slurry composition having positive charges, a polishing rate, a selectivity and a planarization degree may decrease due to aggregation and reaction with the slurry composition. A positive slurry may realize a high polishing rate with a high reaction with a wafer and a pad, however, may be vulnerable to the selectivity and the planarization degree. Thus, there is a desire for development of an additive composition to increase a selectivity and a planarization degree while maintaining a high polishing rate when the additive composition is used together with a positive slurry composition.

SUMMARY

The present disclosure is to solve the foregoing problems, and an aspect of the present disclosure is to provide an additive composition that may enhance a planarization degree and that may prevent occurrence of dishing, scratches and defects while maintaining a high polishing speed and a high selectivity, and to provide a positive polishing slurry composition including the additive composition.

However, the problems to be solved in the present disclosure are not limited to the foregoing problems, and other problems not mentioned herein would be clearly understood by one of ordinary skill in the art from the following description.

According to an aspect, there is provided an additive composition including a cationic compound, an organic acid, a nonionic compound, and a pH adjuster.

The cationic compound may include at least one of an amino acid, polyalkylene glycol, a high-molecular polysaccharide coupled to a glucosamine compound and an amine group-containing polymer.

The organic acid may include at least one of acetic acid, citric acid, lactic acid, malic acid, maleic acid, malonic acid, glycolic acid, propionic acid, butyric acid, hydroxybutyric acid, nitrilotriacetic acid, picolinic acid, nicotinic acid, isonicotinic acid, fusaric acid, dinicotinic acid, dipicolinic acid, lutidinic acid, quinolinic acid, glutamic acid, alanine, glycine, cystine, histidine, asparagine, guanidine, hydrazine, formic acid, benzoic acid, oxalic acid, succinic acid, tricarballyic acid, tartaric acid, aspartic acid, glutaric acid, adipic acid, suberic acid, fumaric acid, phthalic acid and pyridinecarboxylic acid.

A ratio of the cationic compound:the organic acid in the additive composition may range from 2:1 to 3:1.

Each of the cationic compound and the organic acid may be present in an amount of 0.001% by weight (wt %) to 5 wt % in the additive composition.

The nonionic compound may include at least one of polyethylene glycol (PEG), polypropylene glycol (PPG), polyvinylpyrrolidone (PVP), an ethylene oxide-propylene oxide copolymer, a polyethylene-propylene copolymer, polyalkyl oxide, polyethylene oxide (PEO), polyoxyethylene (POE) and polypropylene oxide.

The nonionic compound may be present in an amount of 0.001 wt % to 1 wt % in the additive composition.

The pH adjuster may include at least one of: an acidic material including at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof; and an alkaline material including at least one of ammonia, amino methyl propanol (AMP), potassium hydroxide, sodium hydroxide, magnesium hydroxide, rubidium hydroxide, cesium hydroxide, sodium hydrogen carbonate, sodium carbonate and imidazole.

The additive composition may have pH ranging from 2 to 7.

According to another aspect, there is provided a positive polishing slurry composition including the additive composition, and a slurry composition including abrasive particles.

A polishing selectivity of an oxide film:a nitride film or the oxide film:a polysilicon film may range from 10:1 to 80:1 during polishing of a blanket wafer including the oxide film and either the nitride film or the polysilicon film using the positive polishing slurry composition.

The oxide film may have a polishing rate of 2,000 angstroms per minute (Å/min) to 4,000 Å/min, and the nitride film or the polysilicon film may have a polishing rate of 20 Å/min to 200 Å/min.

A polishing selectivity of an oxide film:a nitride film or the oxide film:a polysilicon film may range from 1:1 to 5:1 during polishing of a pattern wafer including the oxide film and either the nitride film or the polysilicon film using the positive polishing slurry composition.

Dishing of 200 Å or less may occur, after a wafer that includes an oxide film and either a nitride film or a polysilicon film and that has a line-and-space pattern with a line width of 100 micrometers (μm) and a pitch less than 100 μm is polished using the positive polishing slurry composition. Dishing of 320 Å or less may occur, after a wafer that includes an oxide film and either a nitride film or a polysilicon film and that has a line-and-space pattern with a line width of 100 μm or greater and 1 millimeters (mm) or less and a pitch of 100 μm or greater and 1 mm or less is polished using the positive polishing slurry composition.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 1 is a cross-sectional view illustrating a pattern wafer to be evaluated using positive polishing slurry compositions including additive compositions prepared in Examples 1 to 6 and Comparative Examples 1 and 2 according to an embodiment.

DETAILED DESCRIPTION

Hereinafter, embodiments of the present disclosure will be described in detail with reference to the accompanying drawings. When it is determined detailed description related to a related known function or configuration they may make the purpose of the present disclosure unnecessarily ambiguous in describing the present disclosure, the detailed description will be omitted here. Also, terms used herein are defined to appropriately describe the embodiments and thus may be changed depending on a user, the intent of an operator, or a custom of a field to which the present disclosure pertains. Accordingly, the terms must be defined based on the following overall description of this specification. Like reference numerals present in the drawings refer to the like elements throughout.

It will be understood throughout the whole specification that, unless specified otherwise, when one part "includes" or "comprises" one component, the part does not exclude other components but may further include the other components.

Hereinafter, an additive composition and a positive polishing slurry composition including the additive composition will be described in detail with reference to embodiments and drawings. However, the present disclosure is not limited to the embodiments and drawings.

According to an embodiment, an additive composition may include a cationic compound, an organic acid, a nonionic compound, and a pH adjuster.

The additive composition may refer to materials added to a polishing slurry composition except water, to adjust polishing characteristics, for example, a polishing speed or a polishing selectivity, and characteristics of abrasive particles, for example, storage stability and dispersibility of abrasive particles.

A slurry composition additive according to a related art generally has a selectivity and a planarization degree based on a carboxylic group-containing polymer, and is optimized for a negative slurry. When the slurry composition additive is used in a positive slurry composition, a polishing rate, a selectivity and a planarization degree may be significantly reduced due to aggregation and reaction with a slurry composition. However, the additive composition including the cationic compound, the organic acid, the nonionic compound, and the pH adjuster according to the embodiment may provide a high polishing rate, a high selectivity and a high planarization degree even when the additive composition is used together with a positive slurry.

The cationic compound may be a compound including a cation or a group ionized as a cation in a main chain or a side chain.

The cationic compound may include, for example, at least one of an amino acid, polyalkylene glycol, a high-molecular polysaccharide coupled to a glucosamine compound and an amine group-containing polymer.

The amino acid may enhance dispersibility of abrasive particles, to further increase a polishing speed of an insulating film. The amino acid may include, for example, at least one of arginine, lysine, asparaginic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

The polyalkylene glycol may enhance polishing characteristics, for example, a polishing selectivity or a planarization degree. The polyalkylene glycol may include, for example, polyethylene glycol, polypropylene glycol and polybutylene glycol.

The high-molecular polysaccharide may include, for example, at least one of chitin, chitosan, chitooligosaccharide, mucopolysaccharide, proteoglycan, heparin, alginic acid, cellulose, hyaluronic acid, carrageenan, β-glucan and chondroitin sulfate.

The glucosamine compound included in the high-molecular polysaccharide may be glucosamine or glucosamine derivatives, and may include, for example, at least one of N-acetyl-D-glucosamine, N-methylglucosamine, N-acetyl-galactosamine, 2-acetamido-2-deoxy-β-D-glucose (N-acetyl glucosamine), poly(β-(1,4)-glucosamine), poly-N-succinyl-β-1-6-glucosamine (PNSG), poly-N-acetyl β-1-6-glucosamine (PNAG), N-acylglucosamine, glucosamine hydrochloride and glucosamine oligosaccharide.

The amine group-containing polymer may increase a polishing speed of an insulating film, for example, an oxide film or a nitride film, while preventing a decrease in a planarization degree, and may prevent occurrence of dishing, scratches and defects. The amine group-containing polymer may include, for example, at least one of primary amine, secondary amine, tertiary amine and a cationic polymer.

The primary amine, the secondary amine and the tertiary amine may include, for example, at least one of methylamine, butylamine, ethanolamine, isopropylamine, diethanolamine, triethanolamine, dipropylamine, ethylene diamine, propanediamine, triethylenetetramine, tetraethylenepentamine, 2-amino-2-methyl-1-propanol (AMP), 3-amino-1-propanol, 2-amino-1-propanol, 1-amino-2-propanol and 1-amino-phentanol.

The cationic polymer may include at least two ionized cations in a molecular formula, and may desirably include at least two nitrogen atoms activated as cations. The cationic polymer may be a quaternary ammonium polymer. The cationic polymer may include, for example, at least one of poly(diallyldimethyl ammonium chloride; poly[bis(2-chloroethyl) ether-alt-1,3-bis[3-(dimethylamino)propyl]urea]; ethanol, 2,2',2''-nitrilotris-, polymer with 1,4-dichloro-2-butene and N,N,N',N'-tetramethyl-2-butene-1,4-diamine; a hydroxyethyl cellulose dimethyl diallylammonium chloride copolymer; a copolymer of acrylamide and diallyldimethylammonium chloride; a copolymer of acrylamide and quaternized dimethylammoniumethyl methacrylate; a copolymer of acrylic acid and diallyldimethylammonium chloride; an acrylamide-dimethylaminoethyl methacrylate methyl chloride copolymer; quaternized hydroxyethyl cellulose; a copolymer of vinylpyrrolidone and quaternized dimethylaminoethyl methacrylate; a copolymer of vinylpyrrolidone and quaternized vinylimidazole; a copolymer of vinylpyrrolidone and methacrylamidopropyl trimethylammonium; poly(2-methacryloxyethyltrimethylammonium chloride); poly(acrylamide 2-methacryloxyethyltrimethyl ammonium chloride); poly[2-(dimethylamino)ethyl methacrylate) methyl chloride]; poly[(3-acrylamidopropyl) trimethylammonium chloride]; poly[(3-methacrylamidopropyl) trimethylammonium chloride]; poly[oxyethylene(dimethylimino) ethylene (dimethylimino)ethylene dichloride]; a terpolymer of acrylic acid, acrylamide and diallyldimethylammonium chloride; a terpolymer of acrylic acid, methacrylamidopropyl trimethylammonium chloride, and methyl acrylate, a terpolymer of vinylcaprolactam, vinylpyrrolidone, and quaternized vinylimidazole; poly(2-methacryloxyethyl phosphorylcholine-co-n-butyl methacrylate); poly[(dimethylamino) ethyl acrylate benzyl chloride quaternary salt (PDMAEA-BCQ); and poly[(dimethylamino)ethyl acrylate methyl chloride quaternary salt (PDMAEA-MCQ).

The organic acid may include, for example, at least one of acetic acid, citric acid, lactic acid, malic acid, maleic acid, malonic acid, glycolic acid, propionic acid, butyric acid, hydroxybutyric acid, nitrilotriacetic acid, picolinic acid, nicotinic acid, isonicotinic acid, fusaric acid, dinicotinic acid, dipicolinic acid, lutidinic acid, quinolinic acid, glutamic acid, alanine, glycine, cystine, histidine, asparagine, guanidine, hydrazine, formic acid, benzoic acid, oxalic acid, succinic acid, tricarballyic acid, tartaric acid, aspartic acid, glutaric acid, adipic acid, suberic acid, fumaric acid, phthalic acid and pyridinecarboxylic acid.

A ratio of the cationic compound:the organic acid in the additive composition may range from 2:1 to 3:1. Each of the cationic compound and the organic acid may be present in an amount of 0.001% by weight (wt %) to 5 wt %, desirably in an amount of 0.01 wt % to 3 wt %, in the additive composition. When each of the amount of the cationic compound and the amount of the organic acid is less than 0.001 wt %, it may be difficult to achieve a desired polishing selectivity and dishing and defects may occur. When each of the amount of the cationic compound and the amount of the organic acid exceeds 5 wt %, a polishing performance may decrease and scratches and defects may occur due to aggregation.

The nonionic compound may include, for example, at least one of polyethylene glycol (PEG), polypropylene glycol (PPG), polyvinylpyrrolidone (PVP), an ethylene oxide-propylene oxide copolymer, a polyethylene-propylene copolymer, polyalkyl oxide, polyethylene oxide (PEO), polyoxyethylene (POE) and polypropylene oxide.

The nonionic compound may be present in an amount of 0.001 wt % to 1 wt % in the additive composition. When the amount of the nonionic compound is less than 0.001 wt %, a nitride film or a poly film may be excessively polished because a polishing stop function for the nitride film or the poly film is not implemented. When the amount of the nonionic compound exceeds 1 wt %, a dispersion stability may decrease, microscratches may occur, and contamination may occur, for example, reattachment of particles.

The pH adjuster may include, for example, at least one of: an acidic material including at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof; and an alkaline material including at least one of ammonia, amino methyl propanol (AMP), potassium hydroxide, sodium hydroxide, magnesium hydroxide, rubidium hydroxide, cesium hydroxide, sodium hydrogen carbonate, sodium carbonate and imidazole.

The pH adjuster may be added to adjust pH of the additive composition. The pH of the additive composition may range from 2 to 7.

The additive composition may enhance a polishing selectivity and a planarization degree and may prevent occurrence of dishing while maintaining a dispersion stability and a high polishing rate, when the additive composition is used together with a positive polishing slurry composition having positive charges.

According to another embodiment, a positive polishing slurry composition may include an additive composition, and a slurry composition including abrasive particles.

The slurry composition may include, for example, an abrasive particle-dispersion layer composite. The abrasive particle-dispersion layer composite may include abrasive particles, a first dispersant that is at least one anionic compound among a copolymer with a functional group of a resonance structure, a carboxyl group-containing polymer and a carboxyl group-containing organic acid, a second dispersant that is at least one cationic compound among an amino acid, an organic acid, polyalkylene glycol and a high-molecular polysaccharide coupled to a glucosamine compound, and a third dispersant that is a cationic polymer including at least two ionized cations in a molecular formula.

The abrasive particles may be electrostatically bonded to the first dispersant, and the first dispersant may be electrostatically bonded to at least one of the second dispersant or the third dispersant. A surface of the abrasive particles, the second dispersant and the third dispersant may have positive charges, and the first dispersant may have negative charges.

The abrasive particles may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia.

The abrasive particles may have a diameter of 10 nanometers (nm) to 300 nm. When the diameter of the abrasive particles is less than 10 nm, a polishing rate may decrease because the abrasive particles are small in size, and it may be difficult to implement a high selectivity. When the diameter of the abrasive particles exceeds 300 nm, it may be difficult to control dishing, a surface defect, the polishing rate and a selectivity because the abrasive particles are large in size.

The abrasive particles may include, for example, abrasive particles prepared by a liquid-phase method. The liquid-phase method may include, for example, a sol-gel method of causing a chemical reaction of abrasive particle precursors in an aqueous solution and of growing crystals, to obtain minute particles, or a coprecipitation method of coprecipitating ions of abrasive particles in an aqueous solution, and a hydrothermal synthesis of forming abrasive particles under high-temperature and high-pressure conditions. The abrasive particles prepared by the liquid-phase method may be dispersed so that the surface of the abrasive particles may have positive charges.

The abrasive particles may be single crystalline particles, but are not limited thereto. When single crystalline abrasive particles are used, a scratch reduction effect may be achieved in comparison to polycrystalline abrasive particles, dishing may be prevented, and cleanability after polishing may be enhanced.

A shape of the abrasive particles may include, for example, at least one of a spherical shape, a square shape, a needle shape or a plate shape, and may desirably be the spherical shape.

The slurry composition including the abrasive particles may be a positive slurry composition having positive charges. The slurry composition may have a positive zeta-potential of 10 millivolts (mV) to 60 mV.

For example, during polishing of a blanket wafer including an oxide film and either a nitride film or a polysilicon film using the positive polishing slurry composition, a polishing selectivity of the oxide film:the nitride film or the oxide film:the polysilicon film may range from 10:1 to 80:1. In this example, the oxide film may have a polishing rate of 2,000 angstroms per minute (Å/min) to 4,000 Å/min, and the nitride film or the polysilicon film may have a polishing rate of 20 Å/min to 200 Å/min. In another example, when a polishing stop film is exposed on a pattern wafer and when dishing is evaluated after overpolishing, a polishing selectivity of an oxide film:a nitride film or the oxide film:a polysilicon film may range from 1:1 to 5:1 and may desirably range from 1:1 to 3:1.

After a wafer that includes an oxide film and a nitride film and that has a line-and-space pattern with a line width of 100 micrometers (μm) and a pitch less than 100 μm is polished using the positive polishing slurry composition, dishing of 200 Å or less may occur. After a wafer that includes an oxide film and a nitride film and that has a line-and-space pattern with a width of 100 μm or greater and 1 millimeters (mm) or less and a pitch of 100 μm or greater and 1 mm or less is polished using the positive polishing slurry composition, dishing of 320 Å or less and scratches of 50 ea or less may occur.

The positive polishing slurry composition may include the additive composition, and thus may be excellent in a dispersion stability, may exhibit a high planarization degree, a high polishing speed and a high selectivity when a wafer including an oxide film and a nitride film is polished, and may have an excellent effect of preventing dishing and scratches from occurring on a polished film.

Hereinafter, the present disclosure will be described in detail with reference to examples and comparative examples. However, the technical idea of the present disclosure is not limited or restricted thereto.

Preparation of Additive Composition

Example 1

Poly[bis(2-chloroethyl) ether-alt-1,3-bis[3-(dimethylamino)propyl]urea] (Mirapol®)) as a cationic compound and lactic acid as an organic acid were mixed at a ratio of 2.5:1 in ultrapure water, and 0.01 wt % of polyethylene glycol (PEG) as a nonionic compound was added thereto, thereby preparing an additive composition of pH 4.5 using nitric acid.

Example 2

An additive composition was prepared in the same manner as in Example 1 except that histidine was added as a cationic compound.

Example 3

An additive composition was prepared in the same manner as in Example 1 except that serine was added as a cationic compound.

Example 4

An additive composition was prepared in the same manner as in Example 1 except that glycolic acid was added as an organic acid.

Example 5

An additive composition was prepared in the same manner as in Example 4 except that histidine was added as a cationic compound.

Example 6

An additive composition was prepared in the same manner as in Example 4 except that serine was added as a cationic compound.

Comparative Example 1

An additive composition was prepared in the same manner as in Example 1 except that lactic acid was not added.

Comparative Example 2

An additive composition was prepared in the same manner as in Example 2 except that lactic acid was not added.

<Preparation of Positive Polishing Slurry Composition>

Each of the additive compositions according to Examples 1 to 6 and Comparative Examples 1 and 2 was mixed with a slurry composition including 5 wt % of ceria abrasive particles, thereby preparing a positive polishing slurry composition.

A non-pattern wafer (hereinafter, referred to as an "NPW") and a pattern wafer were polished using positive polishing slurry compositions including the additive compositions according to Examples 1 to 6 and Comparative Examples 1 and 2 under the following polishing conditions.

[Polishing Conditions]
1. Polishing machine: AP-300 (manufactured by CTS)
2. Pad: K7 (manufactured by Rohm & Haas)
3. Polishing time: 60 sec
4. Table RPM: 87
5. Spindle RPM: 93
6. Flow rate: 300 ml/min
7. Used wafer: 12-inch STI pattern wafer
8. Pressure: 4.0 psi FIG. 1 is a cross-sectional view illustrating a pattern wafer to be evaluated using the positive polishing slurry compositions including the additive compositions according to Examples 1 to 6 and Comparative Examples 1 and 2 according to an embodiment. An overpolishing time of the pattern wafer with respect to a primary NPW was set based on information of the pattern wafer of FIG. 1 during primary polishing. After a time to remove a step of 2,000 Å is set, overpolishing was performed, thereby determining a degree of dishing.

Table 1 shows components of the positive polishing slurry compositions including the additive compositions according to Examples 1 to 6 and Comparative Examples 1 and 2, and dishing results obtained after polishing of NPWs and pattern wafers using the positive polishing slurry compositions.

TABLE 1

| | Cationic compound | Organic acid | Nonionic compound (wt %) | pH adjuster | NPW polishing rate (Å/min) | Pattern dishing (Å) 100 μm/100 μm | 1 mm/1 mm |
|---|---|---|---|---|---|---|---|
| Example 1 | Mirapol ® | Lactic acid | PEG 0.01 | Nitric acid | 2,200 | 30 | 250 |
| Example 2 | Histidine | Lactic acid | PEG 0.01 | Nitric acid | 3,500 | 50 | 300 |
| Example 3 | Serine | Lactic acid | PEG 0.01 | Nitric acid | 3,300 | 50 | 280 |
| Example 4 | Mirapol ® | Glycolic acid | PEG 0.01 | Nitric acid | 2,500 | 37 | 270 |
| Example 5 | Histidine | Glycolic acid | PEG 0.01 | Nitric acid | 3,250 | 45 | 305 |
| Example 6 | Serine | Glycolic acid | PEG 0.01 | Nitric acid | 3,700 | 50 | 320 |
| Comparative Example 1 | Mirapol ® | — | PEG 0.01 | Nitric acid | 2,500 | 100 | 450 |
| Comparative Example 2 | Histidine | — | PEG 0.01 | Nitric acid | 3,500 | 580 | 1,100 |

Referring to Table 1, NPW polishing rates of Examples 1 to 6 are within a range of 2,000 Å/min to 4,000 Å/min according to an embodiment, however, Comparative Examples 1 and 2 show relatively high pattern dishing values even though NPW polishing rates of Comparative Examples 1 and 2 are within the range. Also, in terms of pattern dishing, dishing of 50 Å or less occurred in a pattern of 100 μm/100 μm and dishing of 320 Å or less occurred in a pattern of 1 mm/1 mm in Examples 1 to 6. However, Comparative Examples 1 and 2 show relatively high dishing values in both the pattern of 100 μm/100 μm and the pattern of 1 mm/1 mm. Thus, it may be verified that the positive polishing slurry compositions including the additive compositions according to Examples 1 to 6 show an excellent effect of preventing dishing.

Table 2 shows a polishing selectivity for a pattern wafer of 100 μm/100 μm and a pattern wafer of 1 mm/1 mm using the positive polishing slurry compositions including the additive compositions according to Examples 1 to 6 and Comparative Examples 1 and 2. A polishing selectivity (for example, a ratio of polishing rates) between an oxide film and a nitride film or between an oxide film and a polysilicon film is shown during evaluation of dishing occurring on the pattern wafers.

TABLE 2

| | Polishing selectivity for pattern wafers | | | |
|---|---|---|---|---|
| | 100 μm/100 μm | | 1 mm/1 mm | |
| | Oxide film/ Nitride film | Oxide film/ Poly-silicon film | Oxide film/ Nitride film | Oxide film/ Poly-silicon film |
| Example 1 | 2.0 | 1.5 | 2.5 | 1.9 |
| Example 2 | 1.6 | 1.3 | 2.0 | 1.7 |
| Example 3 | 1.7 | 1.4 | 2.0 | 1.6 |
| Example 4 | 2.1 | 1.7 | 2.8 | 2.0 |
| Example 5 | 1.5 | 1.3 | 1.9 | 1.8 |
| Example 6 | 1.6 | 1.8 | 2.0 | 1.9 |
| Comparative Example 1 | 3.1 | 3.3 | 3.8 | 3.5 |
| Comparative Example 2 | 7.3 | 9.7 | 11.0 | 12.2 |

Referring to Table 2, it is found that a polishing selectivity between the oxide film and the nitride film and a polishing selectivity between the oxide film and the polysilicon film are less than or equal to "3" in both polishing of pattern wafers of 100 μm/100 μm and polishing of pattern wafers of 1 mm/1 mm in Examples 1 to 6. In Comparative Example 1, relatively high dishing values are shown in Table 1, and relatively low polishing selectivities are shown in polishing of a pattern wafer of 100 μm/100 μm and polishing of a pattern wafer of 1 mm/1 mm. Also, in Comparative Example 2, relatively high polishing selectivities, that is, polishing selectivities exceeding "7" are shown in both polishing of a pattern wafer of 100 μm/100 μm and polishing of a pattern wafer of 1 mm/1 mm.

Thus, it may be verified that the positive polishing slurry compositions including the additive compositions according to Examples 1 to 6 have an excellent effect of preventing dishing while maintaining a high polishing rate.

According to embodiments, an additive composition may exhibit a high polishing selectivity, a high planarization degree and a low degree of dishing while maintaining a dispersion stability and a high polishing rate, when the additive composition is used together with a positive polishing slurry composition having positive charges.

Also, according to embodiments, a positive polishing slurry composition may include the additive composition, and thus may be excellent in a dispersion stability, may exhibit a high planarization degree, a high polishing speed and a high selectivity when a wafer including an oxide film and a nitride film is polished, and may have an excellent effect of preventing dishing and scratches from occurring on a polished film.

Although a few embodiments of the present disclosure have been shown and described, the present disclosure is not limited to the described embodiments. Instead, it would be appreciated by those skilled in the art that changes may be made to these embodiments without departing from the principles and spirit of the present disclosure, the scope of which is defined by the claims and their equivalents.

What is claimed is:

1. An additive composition comprising:
a cationic compound;
an organic acid;
a nonionic compound; and
a pH adjuster,
wherein a ratio of the cationic compound to the organic acid in the additive composition is from 2:1 to 3:1, and
wherein each of the cationic compound and the organic acid is present in an amount of 0.001 wt % to 5 wt % in the additive composition,
wherein the cationic compound is at least one selected from the group consisting of poly[bis(2-chloroethyl)ether-alt-1,3-bis[3-(dimethylamino)propyl]urea], histidine, and serine,
wherein the organic acid comprises at least one selected from the group consisting of lactic acid and glycolic acid,
wherein the nonionic compound is a polyethylene glycol (PEG),
wherein dishing of 200 Å or less occurs, after a wafer that includes an oxide film and either a nitride film or a polysilicon film and that has a line-and-space pattern with a line width of 100 μm and a pitch less than 100 μm is polished using a positive polishing slurry composition comprising the additive composition, and
wherein dishing of 320 Å or less occurs, after a wafer that includes an oxide film and either a nitride film or a polysilicon film and that has a line-and-space pattern with a line width of 100 μm or greater and 1 mm or less and a pitch of 100 μm or greater and 1 mm or less is polished using a positive polishing slurry composition comprising the additive composition.

2. The additive composition of claim 1, wherein the nonionic compound is present in an amount of from 0.001 wt % to 1 wt % in the additive composition.

3. The additive composition of claim 1, wherein the pH adjuster comprises at least one selected from the group consisting of:
an acidic material comprising at least one selected from the group consisting of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof; and
an alkaline material comprising at least one selected from the group consisting of ammonia, amino methyl propanol (AMP), potassium hydroxide, sodium hydroxide, magnesium hydroxide, rubidium hydroxide, cesium hydroxide, sodium hydrogen carbonate, sodium carbonate and imidazole.

4. The additive composition of claim 1, wherein the additive composition has a pH of from 2 to 7.

5. A positive polishing slurry composition comprising:
the additive composition of claim 1; and
a slurry composition comprising abrasive particles.

6. The positive polishing slurry composition of claim 5, wherein a polishing selectivity of an oxide film:a nitride film or the oxide film:a polysilicon film ranges from 10:1 to 80:1 during polishing of a blanket wafer including the oxide film and either the nitride film or the polysilicon film using the positive polishing slurry composition.

7. The positive polishing slurry composition of claim 6, wherein the oxide film has a polishing rate of 2,000 angstroms per minute (Å/min) to 4,000 Å/min, and
wherein the nitride film or the polysilicon film has a polishing rate of 20 Å/min to 200 Å/min.

8. The positive polishing slurry composition of claim 5, wherein a polishing selectivity of an oxide film:a nitride film or the oxide film:a polysilicon film ranges from 1:1 to 5:1 during polishing of a pattern wafer including the oxide film and either the nitride film or the polysilicon film using the positive polishing slurry composition.

9. The additive composition of claim 1, wherein the amount of each of the cationic compound and the organic acid in the additive composition is from 0.01 wt % to 3 wt %.

* * * * *